(12) United States Patent
Henke et al.

(10) Patent No.: US 10,648,709 B2
(45) Date of Patent: May 12, 2020

(54) HEAT EXCHANGER FOR THE TEMPERATURE CONTROL OF A BATTERY

(71) Applicant: Mahle International GmbH, Stuttgart (DE)

(72) Inventors: Timo Henke, Kernen/Rommelshausen (DE); Stefan Hirsch, Stuttgart (DE); Manuel Wehowski, Stuttgart (DE)

(73) Assignee: Mahle International GmbH (DE)

( * ) Notice: Subject to any disclaimer, the term of this patent is extended or adjusted under 35 U.S.C. 154(b) by 0 days.

(21) Appl. No.: 15/770,190

(22) PCT Filed: Oct. 21, 2016

(86) PCT No.: PCT/EP2016/075359
§ 371 (c)(1),
(2) Date: Apr. 20, 2018

(87) PCT Pub. No.: WO2017/068115
PCT Pub. Date: Apr. 27, 2017

(65) Prior Publication Data
US 2018/0313584 A1    Nov. 1, 2018

(30) Foreign Application Priority Data

Oct. 23, 2015   (DE) .................. 10 2015 220 759

(51) Int. Cl.
*F25B 21/02*   (2006.01)
*F25B 21/04*   (2006.01)
(Continued)

(52) U.S. Cl.
CPC .......... *F25B 21/04* (2013.01); *B60H 1/00278* (2013.01); *F25B 21/02* (2013.01);
(Continued)

(58) Field of Classification Search
CPC .... F25B 21/02; F25B 21/04; F25B 2321/023; F25B 2321/02; F25B 2321/025; F25B 2321/0252
See application file for complete search history.

(56) References Cited

U.S. PATENT DOCUMENTS

| | | | | |
|---|---|---|---|---|
| 5,784,890 A | * | 7/1998 | Polkinghorne | ......... F25B 21/02 165/104.12 |
| 9,470,438 B2 | * | 10/2016 | Grunwald | ............... F25B 21/02 |

(Continued)

FOREIGN PATENT DOCUMENTS

| | | |
|---|---|---|
| DE | 102006011794 B3 | 9/2007 |
| DE | 102011107607 A1 | 1/2013 |

(Continued)

OTHER PUBLICATIONS

English abstract for DE-102011107607.
English abstract for DE-102014002247.
English abstract for DE-102006011794.

*Primary Examiner* — Brian M King
(74) *Attorney, Agent, or Firm* — Fishman Stewart PLLC

(57) ABSTRACT

A heat exchanger for the temperature control of a battery may include a first cover and a second cover between which a supporting frame may be arranged in a sandwiched manner. The supporting frame may surround a passage opening in which at least one thermoelectric element may be arranged. At least one fluid channel for the flow of a fluid therethrough may be formed in the first cover. The heat exchanger may also include a plurality of clip-like fastening elements mounted on an outer circumferential edge, which may be formed by the first and second covers and the supporting frame, along a circumferential direction. The fastening elements may press the first and second covers against one another and against the supporting frame.

17 Claims, 1 Drawing Sheet

(51) Int. Cl.
*F28F 3/12* (2006.01)
*H01M 10/6572* (2014.01)
*H01M 10/6556* (2014.01)
*H01L 35/32* (2006.01)
*B60H 1/00* (2006.01)

(52) U.S. Cl.
CPC ............... *F28F 3/12* (2013.01); *H01L 35/32* (2013.01); *H01M 10/6556* (2015.04); *H01M 10/6572* (2015.04); *F25B 2321/023* (2013.01); *F25B 2321/0252* (2013.01)

(56) References Cited

U.S. PATENT DOCUMENTS

| | | | |
|---|---|---|---|
| 2006/0191271 A1* | 8/2006 | Takahashi | F25B 21/04 62/3.7 |
| 2014/0251858 A1 | 9/2014 | Cardona Jimenez et al. | |
| 2016/0150683 A1* | 5/2016 | Sagerian | H04N 5/64 361/714 |
| 2016/0246340 A1* | 8/2016 | Campagna | F25B 21/04 |
| 2018/0164002 A1* | 6/2018 | Spillner | H01M 10/6572 |

FOREIGN PATENT DOCUMENTS

| | | |
|---|---|---|
| DE | 102012211259 A1 | 1/2014 |
| DE | 102014002247 A1 | 8/2015 |
| EP | 2769932 A2 | 8/2014 |

* cited by examiner

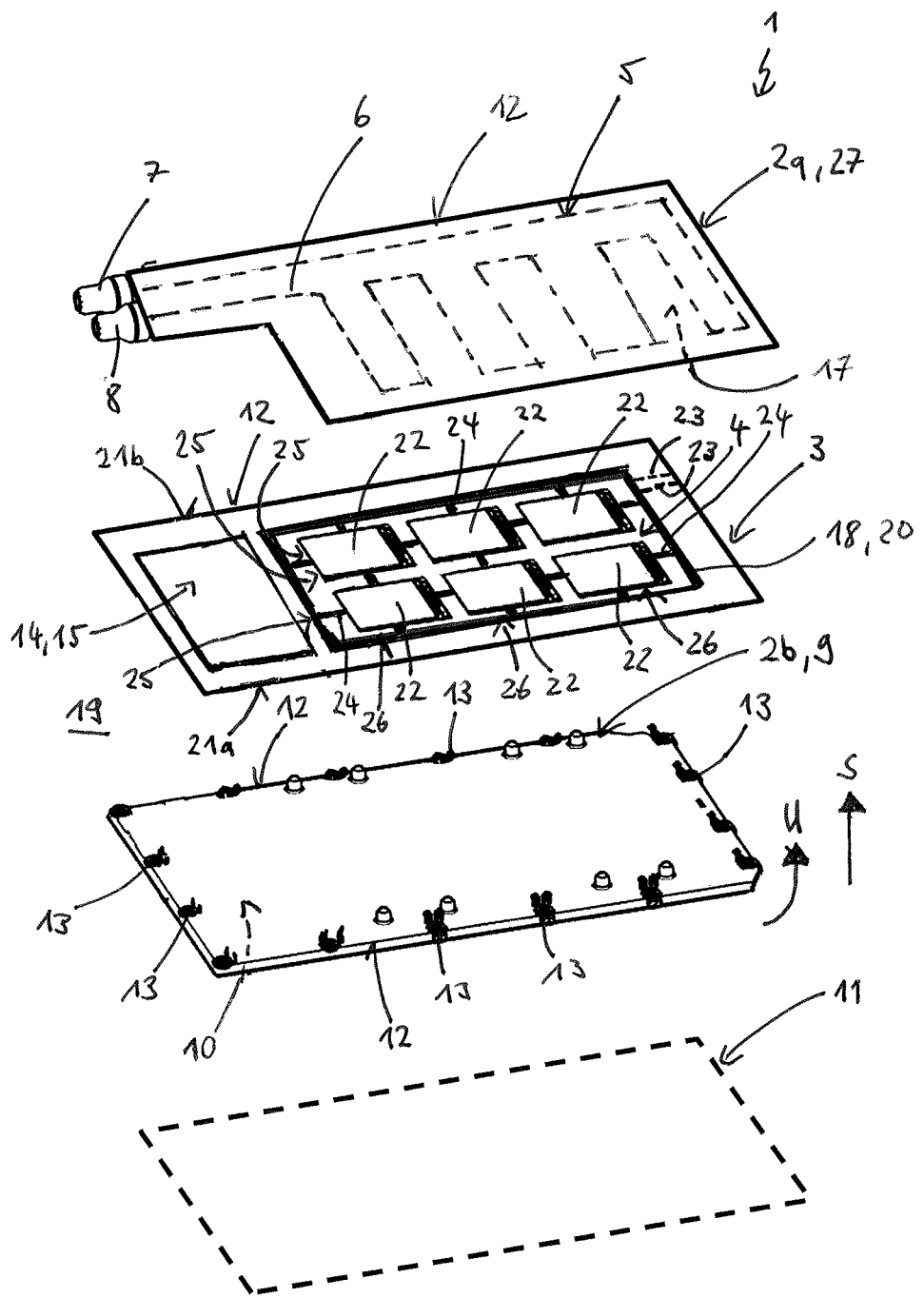

HEAT EXCHANGER FOR THE TEMPERATURE CONTROL OF A BATTERY

CROSS-REFERENCE TO RELATED APPLICATIONS

This application claims priority to International Patent Application No. PCT/EP2016/075359, filed on Oct. 21, 2016, and German Patent Application No. DE 10 2015 220 759.5, filed on Oct. 23, 2015, the contents of both of which are incorporated herein by reference in their entireties.

TECHNICAL FIELD

The invention relates to a heat exchanger, in particular a thermoelectric heat pump, for the temperature control of a battery, and a battery arrangement with such a heat exchanger.

BACKGROUND

The term "thermoelectricity" is understood to mean the reciprocal influence of temperature and electricity and their conversion into one another. Thermoelectric materials make use of this influence, in order to generate electrical energy from waste heat, as electric generators, but also come into use in the form of so-called heat pumps if, with the use of electrical energy, heat is to be transported from a temperature reservoir with lower temperature into one with higher temperature.

Particularly thermoelectric heat pumps are used in vehicle technology in the cooling of the most varied of components, such as e.g. modern lithium-ion batteries, which develop waste heat to a considerable extent during operation. Such thermoelectric heat exchangers in the form of heat pumps can, however, also be used in electric motor vehicles as a combined heating and cooling device, for instance for the temperature control of the passenger compartment, especially as they have a distinctly higher efficiency than, for instance, conventional electric resistance heaters. The fields of application of thermoelectric heat exchangers in motor vehicles are therefore diverse in nature.

The use in a motor vehicle always leads to the requirement to produce thermoelectric heat exchanges with high efficiency and in a compact construction. Heat exchangers installed in vehicles are therefore often produced in plate- or layered construction, wherein the thermoelectrically active elements are arranged within a thermally conductive housing and are supplied with an external electrical supply voltage for the transport of heat.

SUMMARY

It is an object of the present invention to indicate new ways in the development of heat exchangers with thermoelectric elements.

This problem is solved by the subject of the independent claims. Preferred embodiments are the subject of the dependent claims.

A heat exchanger according to the invention for the temperature control of a battery, in particular a thermoelectric heat pump, comprises a first and a second cover, which lie opposite one another. Between the two covers, a supporting frame is arranged, which surrounds a passage opening. In the passage opening at least one thermoelectric element is arranged, and in the first cover at least one fluid channel is formed for the fluid of a fluid therethrough. The second cover of the heat exchanger serves here for the mounting of the heat exchanger onto the battery which is to be temperature-controlled. By thermal coupling of the first cover via the supporting frame, and the second cover to the battery which is to be temperature-controlled, the fluid flowing through the at least one fluid channel can emit heat to the battery or can receive heat from the latter. Such a heat exchange between the fluid—in the case where the battery is to be cooled, a coolant or refrigerant can be used as fluid—is assisted by the at least one thermoelectric element, if the latter is operated in the manner of a heat pump. For this, it is merely necessary to apply an external electrical supply voltage to the thermoelectrically active element, so that the latter—depending on the polarization of said electric voltage—owing to the thermoelectric effect transports heat from the second cover to the first cover or vice versa.

The arrangement of the at least one thermoelectric element in a sandwiched manner in a supporting frame between two covers permits a realization of the heat exchanger with a small requirement for installation space, in particular along a stacking direction, along which the two covers and the supporting frame with the at least one thermoelectric element are stacked on one another.

As a result, the heat exchanger according to the invention, which is presented here, permits an improved temperature control of a thermally coupled battery with a very small installation space requirement. In particular, the arrangement, according to the invention, of the individual components of the heat exchanger enables its realization in a flat construction, which on the one hand permits a laminar and therefore effective temperature control of the coupled battery, and on the other hand considerably improves the arrangement of the heat exchanger in the engine block of a motor vehicle with a high component density.

To improve the heat exchange between the fluid and the at least one thermoelectric element, it is proposed in an advantageous further development of the invention to arrange flow-directing elements, in particular turbulence-generating elements, in the at least one fluid channel, for the fluid flowing through the fluid channel. By means of the turbulent flows or respectively turbulences generated in this way in the fluid, the thermoelectric element and therefore the battery which is to be temperature-controlled are accompanied by an improved heat exchange.

Particularly expediently, the second cover can be realized as a cover plate, which is configured so as to be substantially flat at least one a side facing away from the supporting frame, so that it is able to be mounted in a laminar manner on the battery housing of a battery unit which is to be temperature-controlled by means of the heat exchanger. This characteristic of the second cover also leads to an improved heat exchange.

In a preferred embodiment, a plurality of clip-like fastening elements is mounted on an outer circumferential edge of the heat exchanger, which is formed by the two covers and the supporting frame, along the circumferential direction. By means of these fastening elements, the two covers are pressed both against one another and also respectively against the supporting frame. This improves the thermal coupling of the two covers onto the supporting frame and onto the at least one thermoelectric element arranged therein.

Particularly preferably, in addition to the passage opening, at least one further opening can be provided in the supporting frame, in which opening no thermoelectric element is arranged. Said further opening forms between the two covers a cavity which acts as thermal insulation between the two covers. In this way, it can be ensured that the heat exchange between the two covers takes place largely or even exclusively via the at least one thermoelectric element. This enables a precise controlling of the heat exchange which is to be provided by the heat exchanger, by providing an external electrical supply voltage applied to the at least one thermoelectric element.

Particularly expediently, the supporting frame can have a frame material which comprises of at least 75% a plastic or consists of at least 75% of such a plastic. Preferably, the supporting frame consists entirely of plastic. Therefore, the first cover can be electrically insulated from the second cover. An undesired electric short-circuit of the typically metallic battery housing via the two covers of the heat exchanger with a further component made of an electrically conductive material, not belonging to the heat exchanger, can be prevented in this way.

In a further preferred embodiment, which involves particularly low manufacturing costs, the first cover is formed in two layers with a first layer facing the supporting frame and a second layer facing away from the supporting frame. In this variant, the at least one fluid channel of the channel structure is formed between the two layers.

In an advantageous further development, a side of the first cover, in particular of the first layer, facing the supporting frame, is formed so as to be flat in a surface region of at least 75%. Particularly preferably, this side is formed so as to be substantially entirely flat—therefore entirely flat apart from unevennesses with negligible lateral extent. This characteristic of the first cover facilitates the realization of the heat exchanger in flat construction.

In another advantageous further development, the at least one thermoelectric element is a Peltier element. Such Peltier elements are commercially available in large quantities and at a favourable cost. Therefore, considerable cost advantages arise in the production of the heat exchanger in particular with the use of several Peltier elements.

A particularly high heat transfer efficiency can be achieved in the heat exchanger when at least two thermoelectric elements, preferably a plurality of thermoelectric elements, are arranged adjacent to one another in the passage opening. Said thermoelectric elements are held here in the passage opening of the supporting frame preferably by means of respective holding elements, in particular in the manner of struts. A grid-like arrangement of the thermoelectric elements with at least two grid lines and at least two grid gaps is particularly preferred, because it saves space.

In another preferred embodiment, a sealing device is arranged between the two covers, which seals the cavity, formed by the passage opening of the supporting frame, with respect to the external environment. In this way, the at least one thermoelectric element can be prevented from damage or destruction by contaminations present in the ambient air.

In an advantageous further development, the sealing device comprises two sealing rings which are arranged on opposite sides of the supporting frame and which both respectively surround the passage opening completely circumferentially. In this way, the desired seal can be realized at a favourable cost on both sides of the supporting frame.

The heat exchanger is able to be produced particularly simply and therefore at a favourable cost when the supporting frame is formed as a plastic injection-moulded part, in which at least one electric conductor is arranged for supplying the at least one thermoelectric element with electrical energy from an external electrical energy source. In this variant, the at least one electric conductor is injected around by the plastic of the supporting frame. In this way, a separate electrically insulating casing of the electric conductor can be dispensed with. In a further development, a plurality of such electric conductors can be injected around by the plastic of the supporting frame, respectively insulated electrically from one another. This variant permits a simple electric wiring of the thermoelectric elements present in the supporting frame with an external electrical voltage source.

The invention relates furthermore to a battery arrangement with a battery having a battery housing, and with a heat exchanger, presented above, for the temperature control of the battery, wherein the second cover, for the temperature control of the battery, lies against the battery housing, or forms a portion of the battery housing of the battery. The advantages, explained above, of the heat exchanger are therefore transferred to the battery arrangement.

Further important features and advantages of the invention will emerge from the subclaims, from the drawings and from the associated FIGURE description with the aid of the drawings.

It shall be understood that the features mentioned above and to be explained further below are able to be used not only in the respectively indicated combination, but also in other combinations or in isolation, without departing from the scope of the present invention.

Preferred example embodiments of the invention are illustrated in the drawings and are explained further in the following description, wherein the same reference numbers refer to identical or similar or functionally identical components.

BRIEF DESCRIPTION OF THE DRAWINGS

The lone FIGURE illustrates an exploded illustration of an example of a heat exchanger.

DETAILED DESCRIPTION

The single FIGURE shows in an exploded illustration an example of a heat exchanger 1 according to the invention, which can be used as a thermoelectric heat pump for a battery arrangement. The heat exchanger 1 has a first cover 2a and a second cover 2b, which lie opposite one another along a stacking direction S. Between the two covers 2a, 2b a supporting frame 3 is arranged in a sandwiched manner in the stacking direction S. The supporting frame 3 surrounds a passage opening 4, in which a plurality of thermoelectric elements 22 are arranged.

As the FIGURE clearly demonstrates, the thermoelectric elements 22 are arranged adjacent to and at a distance from one another in the passage opening 4, forming a grid 16. In the FIGURE, six thermoelectric elements 22 are shown by way of example, but the number of thermoelectric elements 22 can be varied in variants of the example. In the example of the FIGURE, the grid 16 with the six thermoelectric elements comprises two grid lines 25 and three grid gaps 26. As the FIGURE additionally shows, the thermoelectric elements 22 can be held in the passage opening 4 by means of suitable holding elements 24. The thermoelectric elements 22 are preferably realized as Peltier elements.

In the first cover 2a, a channel structure 5 with a plurality of fluid channels 6 is formed,—in the FIGURE their possible course is indicated diagrammatically in the first cover 2a—, which channel structure is formed for the flow of a fluid therethrough. Such a fluid can be a coolant or refrigerant, which serves as cooling medium for a battery which is thermally coupled to the heat exchanger 1. Said fluid can enter into the channel structure 5 via a fluid inlet 7 arranged laterally on the first cover 2a, and can exit from the channel structure 5 again via a fluid outlet 8, likewise arranged laterally on the first cover 2a. In the fluid channels 6 of the channel structure 5, flow-directing elements, in particular turbulence-generating elements, not illustrated in closer detail in FIG. 1 for the sake of clarity, can be arranged for the fluid flowing through the channel structure 5. This brings about an improved heat exchange of the fluid with the thermoelectric elements 22.

The second cover 2b is realized as a cover plate 9, which is configured so as to be substantially flat at least on a side 10 facing away from the supporting frame 3. This allows the second cover 2b to be mounted, for highly effective thermal coupling, in a planar manner on the battery housing of a battery unit which is to be temperature-controlled by means of the heat exchanger 1. A housing wall 11 of such a battery housing of the battery which is to be temperature-controlled is indicated by representation in dashed lines in the FIGURE. The first cover 2a can also be configured as a cover plate 27. One or both covers 2a, 2b can be formed as a stamped or sheet metal formed part.

A plurality of clip-like fastening elements 13 can be arranged on a common outer circumferential edge 12 of the heat exchanger, which is formed by the two covers 2a, 2b and the supporting frame 3, along the circumferential direction U thereof. By means of such fastening elements 13, which are shown in the exploded illustration of the FIGURE on the second cover 2b, the two covers 2a, 2b are pressed both against one another and also respectively against the supporting frame 3.

In the supporting frame 3, in addition to the passage opening 4, further openings 14 are provided, in which no thermoelectric elements 22 are arranged. These openings 14 form between the two covers 2a, 2b respective cavities 15, which acts as thermal insulation between the two covers 2a, 2b. In the FIGURE, only a single opening 14 is illustrated by way of example.

Preferably, the supporting frame 3 has a frame material which consists of at least 75% of a plastic. A side 17 of the first cover 2a, facing the supporting frame 3, in particular the first layer, is configured so as to be flat in a surface region of at least 75%. In this way, a good thermal contact of the first cover 2a with the thermoelectric elements 22 is ensured. The supporting frame 3 is preferably formed as a plastic injection-moulded part in which electric conductors 23 are arranged for supplying the thermoelectric elements 22 with electrical energy from an external electrical energy source. The electric conductors, indicated only roughly diagrammatically in the example scenario, are injected around by the plastic of the supporting frame 3 and therefore do not require a separate, electrically insulating casing.

The first cover 2a is preferably configured having two layers and has a first layer facing the supporting frame 3 and a second layer facing away from the supporting frame 3 (the two layers are not shown in the FIGURE, for the sake of clarity). The channel structure 5 with the fluid channels 6 is preferably formed between the two layers.

Between the two covers 2a, 2b a sealing device 18 can be arranged, which seals the cavity, formed by the passage opening 4, with respect to the external environment 19 of the heat exchanger 1. For this, the sealing device can comprise two sealing rings 20, which are arranged on opposite sides 21a, 21b of the supporting frame 3 and which both respectively surround the passage opening 4 completely circumferentially. From the angle of view presented in the FIGURE, only the one of the two sealing rings 20 can be seen which is arranged on the side 21a facing the first cover 2a. Preferably, the sealing rings 20 are made from an elastomer.

The invention claimed is:

1. A heat exchanger for the temperature control of a battery, comprising:
   a first cover and a second cover between which a supporting frame is arranged in a sandwiched manner, the supporting frame surrounding a passage opening in which at least one thermoelectric element is arranged; and
   a plurality of clips mounted on an outer circumferential edge, which is formed by the first and second covers and the supporting frame, along a circumferential direction, the clips pressing the first and second covers against one another and against the supporting frame;
   wherein at least one fluid channel for the flow of a fluid therethrough is formed in the first cover; and
   wherein the supporting frame includes at least one further opening in which no thermoelectric element is arranged, so that the at least one further opening forms between the first and second covers a cavity, which acts as thermal insulation between the first and second covers.

2. The heat exchanger according to claim 1, wherein the second cover is a cover plate that is substantially flat at least on a side facing away from the supporting frame so that the second cover is able to be mounted in a laminar manner on a housing of a battery unit which is to be temperature-controlled by the heat exchanger.

3. The heat exchanger according to claim 1, wherein the supporting frame has a frame material which consists of at least 75% of plastic.

4. The heat exchanger according to claim 1, wherein the first cover has a first layer facing the supporting frame and a second layer facing away from the supporting frame, wherein the at least one fluid channel is formed between the first and second layers.

5. The heat exchanger according to claim 1, wherein at least 75% of a side of the first cover facing the supporting frame is flat in a surface region.

6. The heat exchanger according to claim 1, wherein the at least one thermoelectric element is a Peltier element.

7. The heat exchanger according to claim 1, wherein at least two thermoelectric elements are arranged adjacent to one another in the passage opening and are held in the passage opening via respective holders.

8. The heat exchanger according to claim 1, further comprising a sealer arranged between the first and second covers and that seals a cavity formed by the passage opening with respect to an external environment of the heat exchanger.

9. The heat exchanger according to claim 8, wherein the sealer includes two sealing rings arranged on opposite sides of the supporting frame, each sealing ring entirely circumferentially surround the passage opening.

10. The heat exchanger according to claim 1, wherein:
   the supporting frame is formed as a plastic injection-moulded part, in which at least one electric conductor is arranged for supplying the at least one thermoelectric element with electrical energy from an external electrical energy source; and
   plastic of the supporting frame is injected around the at least one electric conductor.

11. A battery arrangement comprising:
a battery having a battery housing; and
a heat exchanger including:
  a first cover and a second cover between which a supporting frame is arranged in a sandwiched manner, the supporting frame surrounding a passage opening in which at least one thermoelectric element is arranged; and
  a plurality of clips fasteners mounted on an outer circumferential edge, which is formed by the first and second covers and the supporting frame, along a circumferential direction, the clips fasteners pressing the first and second covers against one another and against the supporting frame;
  wherein at least one fluid channel for the flow of a fluid therethrough is formed in the first cover;
  wherein the second cover one of: (i) lies against the battery housing to control the temperature of the battery, or (ii) forms a portion of the battery housing; and
  wherein the supporting frame includes at least one further opening in which no thermoelectric element is arranged, so that the at least one further opening forms between the first and second covers a cavity, which acts as thermal insulation between the first and second covers.

12. The battery arrangement according to claim 11, wherein the second cover is a cover plate that is substantially flat at least on a side facing away from the supporting frame so that the second cover is able to be mounted in a laminar manner on a housing of a battery unit which is to be temperature-controlled by the heat exchanger.

13. The battery arrangement according to claim 11, wherein the supporting frame has a frame material which consists of at least 75% of plastic.

14. The battery arrangement according to claim 11, wherein the first cover has a first layer facing the supporting frame and a second layer facing away from the supporting frame, wherein the at least one fluid channel is formed between the first and second layers.

15. The battery arrangement according to claim 11, wherein at least 75% of a side of the first cover facing the supporting frame is flat in a surface region.

16. The battery arrangement according to claim 11, wherein the at least one thermoelectric element is a Peltier element.

17. A heat exchanger for the temperature control of a battery, comprising:
  a first cover and a second cover between which a supporting frame is arranged in a sandwiched manner, the supporting frame surrounding a passage opening; and
  a plurality of clips mounted on an outer circumferential edge, which is formed by the first and second covers and the supporting frame, along a circumferential direction, the clips pressing the first and second covers against one another and against the supporting frame;
  wherein at least one fluid channel for the flow of a fluid therethrough is formed in the first cover; and
  wherein at least two thermoelectric elements are arranged adjacent to one another in the passage opening and are held in the passage opening via respective holders.

* * * * *